(12) United States Patent
Lin et al.

(10) Patent No.: US 9,940,058 B2
(45) Date of Patent: Apr. 10, 2018

(54) DATA STORAGE DEVICE AND DATA MAINTENANCE METHOD THEREOF

(71) Applicant: Silicon Motion, Inc., Jhubei, Hsinchu County (TW)

(72) Inventors: Chien-Cheng Lin, Yilan (TW); Jie-Hao Lee, Kaohsiung (TW)

(73) Assignee: SILICON MOTION, INC., Jhubei, Hsinchu County (TW)

( * ) Notice: Subject to any disclaimer, the term of this patent is extended or adjusted under 35 U.S.C. 154(b) by 43 days.

(21) Appl. No.: 15/287,998

(22) Filed: Oct. 7, 2016

(65) Prior Publication Data

US 2017/0235489 A1 Aug. 17, 2017

(30) Foreign Application Priority Data

Feb. 17, 2016 (TW) .............................. 105104554 A

(51) Int. Cl.
*G06F 3/06* (2006.01)
*G11C 11/56* (2006.01)
(Continued)

(52) U.S. Cl.
CPC ............ *G06F 3/064* (2013.01); *G06F 3/0616* (2013.01); *G06F 3/0679* (2013.01); *G11C 7/04* (2013.01); *G11C 11/5628* (2013.01); *G11C 11/5635* (2013.01); *G11C 16/08* (2013.01); *G11C 16/10* (2013.01); *G11C 16/16* (2013.01);
(Continued)

(58) Field of Classification Search
CPC .......... G11C 2211/5641; G11C 16/107; G11C 2211/5648; G06F 12/0246; G06F 3/0679; G06F 11/1072; G06F 11/1068; G06F 3/0688; G06F 2212/214; G06F 2212/222; G06F 2212/202; G06F 2212/2022
See application file for complete search history.

(56) References Cited

U.S. PATENT DOCUMENTS 8,984,213 B2    3/2015  Li et al.
2009/0319721 A1  12/2009  Lin
(Continued)

FOREIGN PATENT DOCUMENTS

TW    201001170 A    1/2010
TW    201310237 A    3/2013
(Continued)

*Primary Examiner* — Reginald G Bragdon
*Assistant Examiner* — Thanh D Vo
(74) *Attorney, Agent, or Firm* — McClure, Qualey & Rodack, LLP

(57) ABSTRACT

The present invention provides a data storage device including a flash memory and a controller. The controller distributes TLC-data blocks of the flash memory into three regions, obtains three sub-prewrite data sectors according to a prewrite data sector and a logic address, determines a first TLC-data block according to the logic address, selects a new first TLC-data block with the lowest erase count from the first region when the first TLC-data block has valid data, selects two TLC-data blocks according to the new first TLC-data block, writes the three sub-prewrite data sectors into the new first TLC-data block and the two selected TLC-data blocks, and maps the first new TLC-data block and the two selected TLC-data blocks to the logic address.

10 Claims, 8 Drawing Sheets

(51) Int. Cl.
  *G11C 16/10*  (2006.01)
  *G11C 16/16*  (2006.01)
  *G11C 7/04*  (2006.01)
  *G11C 16/08*  (2006.01)
  *G11C 16/34*  (2006.01)
  *G11C 29/00*  (2006.01)

(52) U.S. Cl.
  CPC .......... *G11C 16/3495* (2013.01); *G11C 29/70* (2013.01); *G06F 2212/202* (2013.01); *G06F 2212/214* (2013.01); *G06F 2212/222* (2013.01); *G11C 2211/5641* (2013.01)

(56) References Cited

U.S. PATENT DOCUMENTS

2014/0059406 A1  2/2014  Hyun et al.
2015/0120988 A1*  4/2015  Hung ................. G06F 12/0246
                                                                711/103

FOREIGN PATENT DOCUMENTS

TW  201321978 A  6/2013
TW  201516678 A  5/2015

* cited by examiner

| logic address | TLC-data block | |
|---|---|---|
| H_1 | F_1 | ⎫ |
| H_2 | F_2 | ⎬ R1 |
| ⋮ | ⋮ | |
| H_N/3 | F_N/3 | ⎭ |
| H_N/3+1 | F_N/3+1 | ⎫ |
| H_N/3+2 | F_N/3+2 | ⎬ R2 |
| ⋮ | ⋮ | |
| H_2N/3 | F_2N/3 | ⎭ |
| H_2N/3+1 | F_2N/3+1 | ⎫ |
| H_2N/3+2 | F_2N/3+2 | ⎬ R3 |
| ⋮ | ⋮ | |
| H_N-1 | F_N-1 | ⎭ |

FIG. 3

| logic address | TLC-data block | |
|---|---|---|
| H_1 | F_1 | |
| H_2 | F_2 | |
| ⋮ | ⋮ | } R1 |
| H_300 | F_300 | |
| H_301 | F_301 | |
| H_302 | F_302 | |
| ⋮ | ⋮ | } R2 |
| H_600 | F_600 | |
| H_601 | F_601 | |
| H_602 | F_602 | |
| ⋮ | ⋮ | } R3 |
| H_900 | F_900 | |

DATA STORAGE DEVICE AND DATA MAINTENANCE METHOD THEREOF

CROSS REFERENCE TO RELATED APPLICATIONS

This Application claims priority of Taiwan Patent Application No. 105104554, filed on Feb. 17, 2016, the entirety of which is incorporated by reference herein.

BACKGROUND OF THE INVENTION

Field of the Invention

The present invention is related to a data maintenance method for a data storage device, and in particular to a triple-level cell data maintenance method.

Description of the Related Art

Flash memory is considered a non-volatile data-storage device, using electrical methods to erase and program itself. NAND Flash, for example, is often used in memory cards, USB flash devices, solid state devices, eMMCs, and other memory devices.

Flash memory such as NAND Flash uses a multiple-block structure to store data, wherein flash memory uses floating gate transistors. The floating gates of the floating gate transistor may catch electronic charges for storing data. However, the electronics might undergo losses from the floating gate due to the operation of the flash memory or various environmental parameters, which can affect data retention. The Triple-Level Cell (TLC) of the flash memory is much more easily affected by the environment than a Single-Level Cell (SLC) or a Multi-Level Cell (MLC). It should be noted that the eMMC module is generally mounted on a motherboard. Therefore, the eMMC modules will pass through the high-temperature stove along with the motherboard, which might lead to data loss.

BRIEF SUMMARY OF THE INVENTION

A detailed description is given in the following embodiments with reference to the accompanying drawings.

An exemplary embodiment provides a data storage device including a flash memory and a controller. The flash memory has a plurality of SLC-spare blocks, a plurality of TLC-data blocks, and a plurality of TLC-spare blocks. The controller equally distributes the TLC-data blocks into three regions having the same number of TLC-data blocks, and receives a prewrite data sector and a logic address of the prewrite data sector, and obtains a first sub-prewrite data sector, a second sub-prewrite data sector and a third sub-prewrite data sector according to the prewrite data sector and the logic address. The controller determines a first TLC-data block corresponding to the logic address of the prewrite data sector according to the logic address, defines the region that contains the first TLC-data block as a first region, determines whether the first TLC-data block has valid data, selects a TLC-data block with the lowest erase count from the first region to serve as a new first TLC-data block when the first TLC-data block has valid data, selects a second TLC-data block and a third TLC-data block from the regions other than the first region according to the new first TLC-data block, respectively writes the first sub-prewrite data sector, the second sub-prewrite data sector and the third sub-prewrite data sector into the new first TLC-data block, the second TLC-data block and the third TLC-data block by a SLC storage mode, and maps the first new TLC-data block, the second TLC-data block, the third TLC-data block to the logic address.

Another exemplary embodiment provides a data maintenance method applied to a data storage device having a plurality of SLC-spare block, and a plurality of TLC-data blocks and a plurality of TLC-spare blocks. The data maintenance method includes: receiving a prewrite data sector and a logic address of the prewrite data sector, and obtaining a first sub-prewrite data sector, a second sub-prewrite data sector and a third sub-prewrite data sector according to the prewrite data sector and the logic address; and writing the prewrite data sector into the data storage device according to the prewrite data sector and the logic address in a first stage, wherein the step of writing the prewrite data sector into the data storage device in the first stage further includes: equally distributing the TLC-data blocks into three regions, wherein the regions have the same number of TLC-data blocks; determining a first TLC-data block corresponding to the logic address of the prewrite data sector according to the logic address, defining the region that contains the first TLC-data block as a first region; determining whether the first TLC-data block has valid data; selecting a TLC-data block with the lowest erase count from the first region to serve as a new first TLC-data block and selecting a second TLC-data block and a third TLC-data block from the regions other than the first region according to the new first TLC-data block when the first TLC-data block has valid data; respectively writing the first sub-prewrite data sector, the second sub-prewrite data sector and the third sub-prewrite data sector into the new first TLC-data block, the second TLC-data block and the third TLC-data block by a SLC storage mode; and mapping the first new TLC-data block, the second TLC-data block, the third TLC-data block to the logic address.

BRIEF DESCRIPTION OF THE DRAWINGS

The present invention can be more fully understood by reading the subsequent detailed description and examples with references made to the accompanying drawings, wherein:

FIG. 3 is a schematic diagram illustrating logic addresses and a TLC-data block, constructed in accordance with an embodiment.

FIG. 4 is a schematic diagram illustrating logic addresses and a TLC-data block, constructed in accordance with another embodiment.

FIG. 5 is a schematic diagram illustrating mapping relationship of blocks, constructed in accordance with an embodiment.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
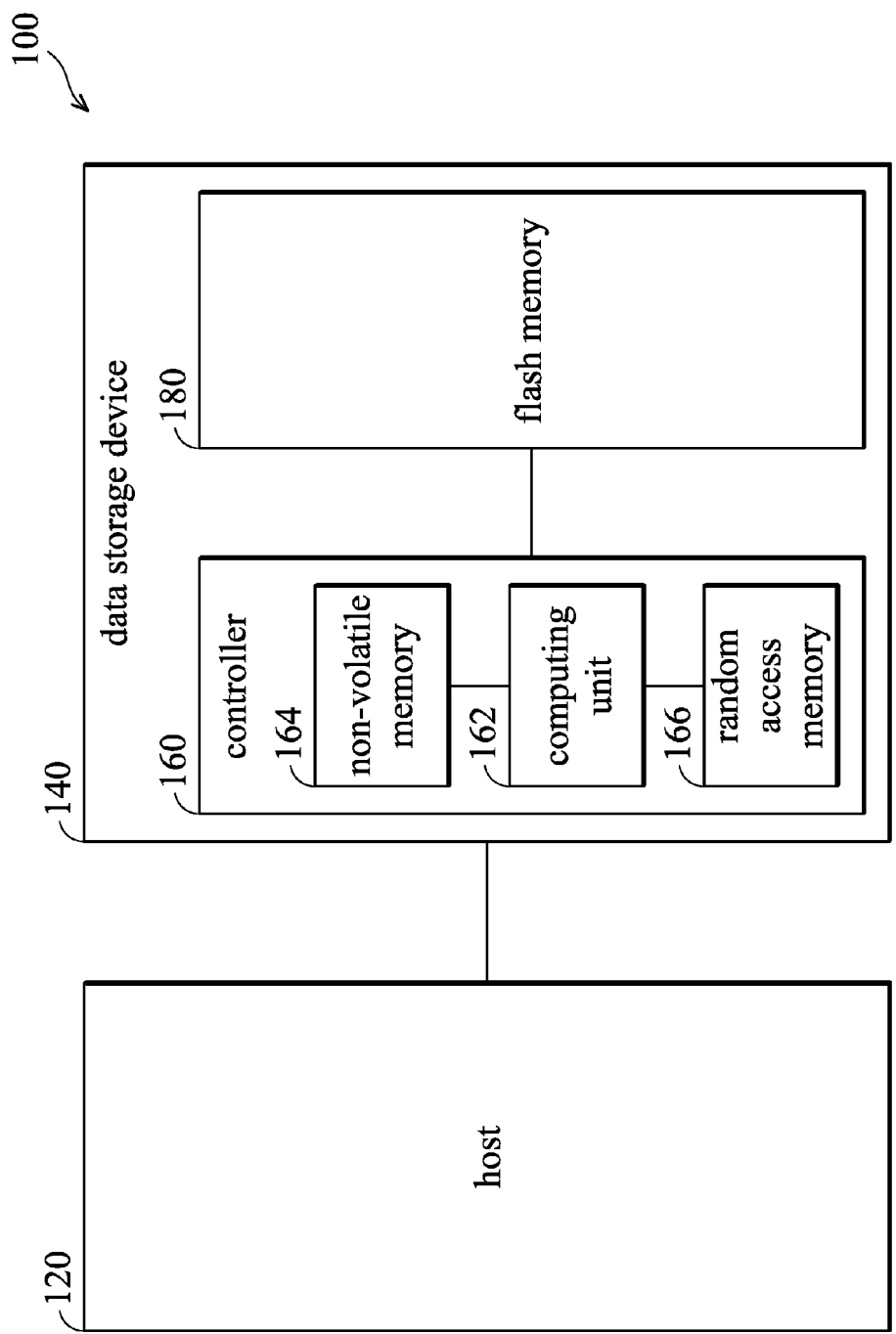
FIG. 1 is a schematic diagram illustrating an electronic system, constructed in accordance with an embodiment.

FIG. 1 is a schematic diagram illustrating an electronic system, constructed in accordance with an embodiment. The electronic system 100 includes a host 120 and a data storage device 140. The data storage device 140 includes a flash memory 180 and a controller 160, and operates in response to the commands of the host 120. The controller 160 includes a computing unit 162, a non-volatile memory 164 (ROM) and a random access memory 166 (RAM). The non-volatile memory 164, the program code stored in the non-volatile memory 164 and data stored in the non-volatile memory 164 constitute firmware executed by the processing unit 162, and the controller 160 is configured to control the flash memory 180 based on the firmware. The flash memory 180 includes a plurality of blocks, each of the blocks has a plurality of pages, wherein the minimum write unit of the flash memory 180 is a page, and the minimum erase unit of the flash memory 180 is a block.

Figure 2:
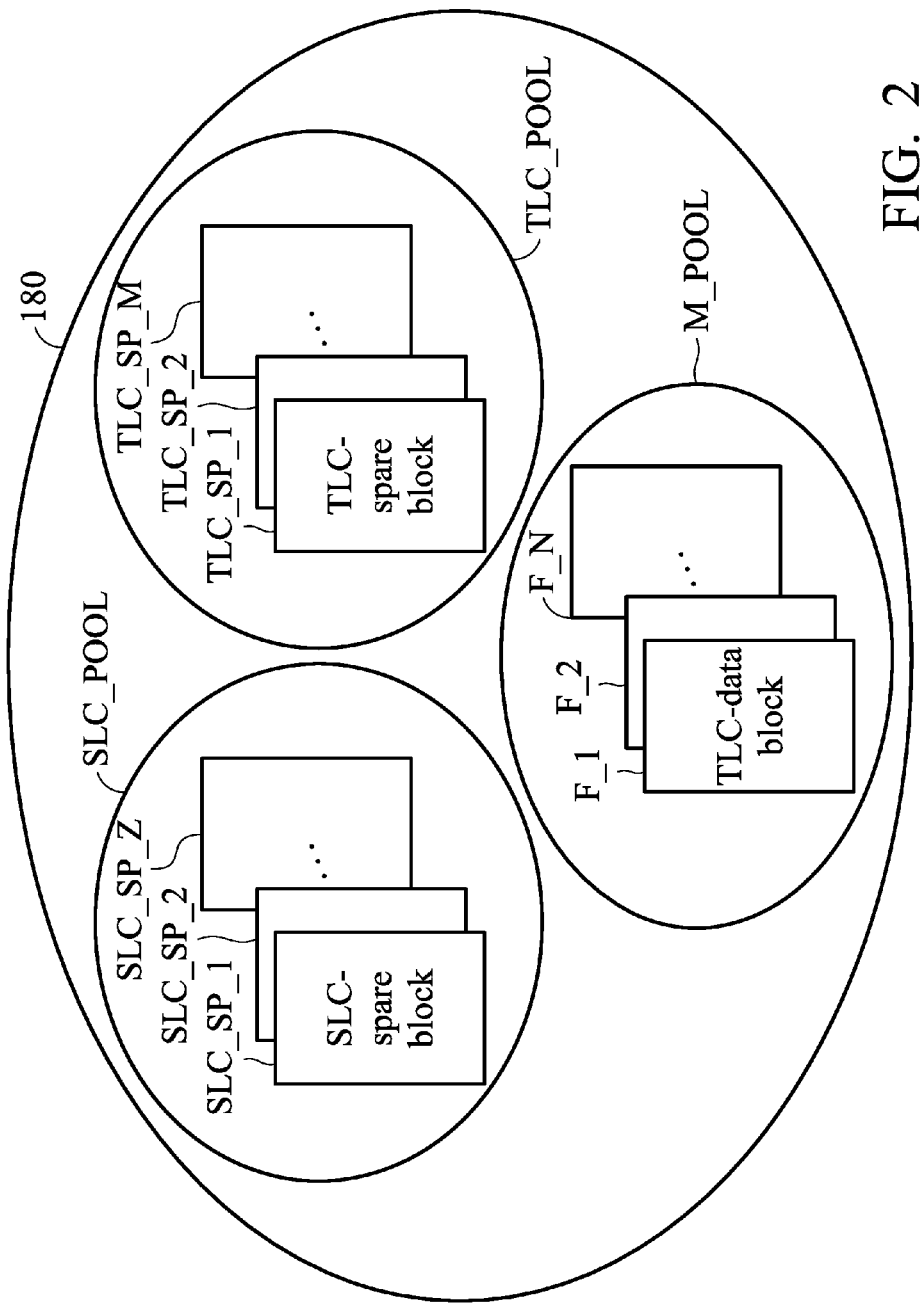
FIG. 2 is a schematic diagram illustrating a flash memory, constructed in accordance with an embodiment.

FIG. 2 is a schematic diagram illustrating a flash memory, constructed in accordance with an embodiment. As shown in FIG. 2, the flash memory 180 has a SLC-spare pool SLC_POOL, a TLC-spare pool TLC_POOL and a TLC-data pool M_POOL. The SLC-spare pool SLC_POOL includes a plurality of SLC-spare blocks SLC_SP_1~SLC_SP_Z, wherein "SLC" is the abbreviation of "Single-Level Cell", the total number of SLC-spare blocks is "Z", and the size of SLC-spare block is equal to the block, but it is not limited thereto. Namely, the SLC-spare blocks SLC_SP_1~SLC_SP_Z are the blocks of the flash memory 180 that are arranged to be written by the SLC storage mode. It should be noted that the SLC-spare blocks SLC_SP_1~SLC_SP_Z of the SLC-spare pool SLC_POOL are arranged to store the data that is going to be programmed into the TLC-spare pool TLC_POOL. The TLC-spare pool TLC_POOL includes a plurality of TLC-spare blocks TLC_SP_0~TLC_SP_M, wherein "TLC" is the abbreviation of "Triple-Level Cell', the total number of SLC-spare blocks is "M", and the size of the TLC-spare block is equal to the block. Namely, the TLC-spare blocks TLC_SP_0~TLC_SP_M are the blocks of the flash memory 180 that are arranged to be written by the TLC storage mode. It should be noted that the TLC-spare pool TLC_POOL is arranged to provide the TLC-spare blocks TLC_SP_0~TLC_SP_M that are without valid data and available to be written, and the TLC-spare block which is written with valid data will be exchanged with a TLC-data block without valid data in the TLC-data pool M_POOL. The TLC-data pool M_POOL has a plurality of TLC-data blocks F_1~F_N, wherein "N" is the total number of SLC-spare blocks, and the size of the TLC-data block is equal to the block. Namely, the TLC-data blocks F_1~F_N are arranged to be written with valid data. It should be noted that the TLC-data pool M_POOL is arranged to provide memory space for users to store data. More specifically, the TLC-data blocks F_1~F_N are respectively assigned to a plurality of logic addresses H_1~H_N, wherein each of the TLC-data blocks F_1~F_N corresponds to one of the logic addresses H_1~H_N, as shown in FIG. 3. More specifically, the TLC-data block F_1 is assigned to the logic address H_1, the TLC-data block F_2 is assigned to the logic address H_2, the TLC-data block F_3 is assigned to the logic address H_3, the TLC-data block F_4 is assigned to the logic address H_4, and so on. Moreover, the TLC-data blocks F_1~F_N and the logic addresses H_1~H_N are arranged from top to bottom according to the addresses.

In one of the embodiments, the flash memory 180 operates by the Triple-Level Cell (TLC) mode. Namely, the TLC-data blocks F_1~F_N of the TLC-data pool M_POOL are Triple-Level Cells. It should be noted that, the triple-level cell is the storage cell obtained by programming a single-level cell. The memory space of the triple-level cell is three times the single-level cell. Although the memory space of the triple-level cell is larger than the single-level cell, the triple-level cell is much more easily affected by the environment, especially the flash memory of Embedded Multi Media Card (eMMC). The eMMC module will pass through the high-temperature stove along with the motherboard, meaning that the data stored in the eMMC module can easily become damaged by the high temperature of the stove. Therefore, present invention provides a data storage device 140 that uses the TLC-data blocks F_1~F_N of the TLC-data pool M_POOL as a single-level cell to write the prewrite data sector into the TLC-data blocks F_1~F_N by SLC mode before passing through the stove (the first stage). It should be noted that, when the TLC-data blocks F_1~F_N of the TLC-data pool M_POOL are used as the single-level cell, the memory space of the TLC-data pool M_POOL will be decreased to be one third of the TLC-data blocks F_1~F_N that are written by the TLC mode. Next, after passing through the stove (the second stage), the data storage device 140 can program the prewrite data sector written by the SLC mode in the TLC-data blocks F_1~F_N into triple-level cells. In one of the embodiments, the first stage is the Production Phase, the second stage, which is after the first stage, is the Integration Phase, and the data storage device goes through a high-temperature soldering event between the first stage and the second stage, but it is not limited thereto.

For example, when the controller 160 receives a prewrite data sector and a logic address of the prewrite data sector, the controller 160 is arranged to write the prewrite data sector into one of the logic addresses H_1~H_N according to the received logic address in the first stage. More specifically, in the present invention, the controller 160 can write the prewrite data sector into the logic address without the sequence of the logic addresses H_1~H_N. Namely, the controller 160 can write the prewrite data sectors in a way that is not in accordance with the order of the logic addresses.

In one of the embodiments, the controller 160 equally distributes the TLC-data blocks F_1~F_N into three regions, wherein the three regions have the same number of TLC-data blocks. More specifically, the controller 160 sequentially assigns the TLC-data blocks F_1~F_N into the regions R1~R3 to select at least one TLC-data block from the TLC-data blocks F_1~F_N to serve as the SLC-spare block noncontinuously, but it is not limited thereto. It should be noted that each of the TLC-data blocks F_1~F_N has an address, and the addresses of the TLC-data blocks F_1~F_N are in sequence. In one of the embodiments, the total number of logic addresses is N, the total number of TLC-data blocks is also N, each of the regions R1~R3 has N/3 number of logic addresses and has N/3 number of TLC-data blocks assigned to the N/3 logic addresses, and the logic addresses of the regions R1~R3 are in sequence, as shown in FIG. 3, but it is not limited thereto. Namely, the region R1 includes the logic addresses H_1~H_N/3 having sequential addresses, and includes the TLC-data blocks F_1~F_N/3 having sequential addresses. The region R2 includes the logic addresses H_N/3+1~H_2N/3 having sequential addresses, and includes the TLC-data blocks F_N/3+1~F_2N/3 having sequential addresses. The region R3 includes the logic addresses H_2N/3+1~H_N having sequential addresses, and includes the TLC-data blocks F_2N/3+1~F_N having sequential addresses. For example, when the total number of logic addresses H_0~H_N is 900, the region R1 has the logic addresses H_1~H_300 and the TLC-data blocks F_1~F_300, the region R2 has the logic addresses H_301~H_600 and the TLC-data blocks F_301~F_600, and the region R3 has the logic addresses H_601~H_900 and the TLC-data blocks F_601~F_900, as shown in FIG. 4. In other embodiments, "N" can be other rational numbers, but it is not limited thereto. Moreover, when "N" cannot be divided evenly by 3, the controller 160 can ignore the remaining one or two TLC-data blocks. For example, "N" is 900 when the total number of TLC-data blocks is 901, and "N" is 1200 when the total number of TLC-data blocks is 1202, but it is not limited thereto.

After the TLC-data blocks F_1~F_N are distributed into the regions R1~R3, the controller 160 divides the prewrite-data into a plurality of sub-prewrite data sectors and writes the sub-prewrite data sectors into the logic addresses. In one of the embodiments, the controller 160 obtains a first sub-prewrite data sector, a second sub-prewrite data sector, a third sub-prewrite data sector by dividing the prewrite data sector. It should be noted that the controller 160 is arranged to divide the prewrite data sector into the sub-prewrite data sectors according to the size of the triple-level cell. Namely, the data length of each of the sub-prewrite data sectors is equal to the data length of the triple-level cell and is three times the data length of the single-level cell. More specifically, the controller 160 determines (selects) a first TLC-data block that corresponds to a first logic address according to the first logic address of the prewrite data sector, and defines the region that contains the first TLC-data block as a first region. Namely, the controller 160 locates a first TLC-data block which is assigned to a first logic address according to a first write command arranged to write a prewrite data sector into the first logic address of the logic addresses H_1~H_N, and defines the region that contains the first TLC-data block as a first region. Next, the controller 160 determines whether the first TLC-data block has valid data. Namely, the controller 160 determines whether the first TLC-data block is mapped to any logic address.

When the first TLC-data block does not have valid data, the controller 160 selects a second TLC-data block and a third TLC-data block from the regions other than the first region with the first TLC-data block, respectively. Namely, when the first TLC-data block is not mapped to any logic address, the controller 160 selects a second TLC-data block and a third TLC-data block from the regions other than the first region with the first TLC-data block, respectively. Next, the controller 160 writes the first sub-prewrite data sector into the first TLC-data block by a SLC storage mode, writes the second sub-prewrite data sector into the second TLC-data block by the SLC storage mode and writes the third sub-prewrite data sector into the third TLC-data block by the SLC storage mode, wherein the controller 160 further maps the first TLC-data block, the second TLC-data block and the third TLC-data block to the first logic address.

When the first TLC-data block has valid data (when the first TLC-data block is not mapped to any logic address), the controller 160 selects another TLC-data block from the first region that contains the first TLC-data block to serve as a new first TLC-data block. Namely, the new TLC-data block is arranged to replace the first TLC-data block assigned to the first logic address. Next, the controller 160 selects a second TLC-data block and a third TLC-data block corresponding to the new first TLC-data block from the remaining two regions other than the first region, respectively. The controller 160 is further arranged to write the first sub-prewrite data sector into the new first TLC-data block by a SLC storage mode, writes the second sub-prewrite data sector into the second TLC-data block by the SLC storage mode and writes the third sub-prewrite data sector into the third TLC-data block by the SLC storage mode. Furthermore, the controller 160 maps the new first TLC-data block, the second TLC-data block and the third TLC-data block to the first logic address.

In one embodiment, each of the TLC-data blocks has a erase count, and the controller 160 selects the TLC-data block that has the lowest erase count and does not have valid data from the first region to serve it as the new first TLC-data block, but it is not limited thereto. Namely, the controller 160 is arranged to select the TLC-data block with the least number of times of being erased and without valid data to be the new first TLC-data block. In other embodiments, the controller 160 can also select the TLC-data block that has no valid data and is the closest one to the first TLC-data block from the first region to serve as the new first TLC-data block.

It should be noted that, in some of the embodiments, the controller 160 is arranged to write the sub-prewrite data sectors into three SLC-spare blocks of the SLC-spare pool SLC_POOL first, and exchanges the written three SLC-spare blocks with the three TLC-data blocks selected from the region R1, region R2 and region R3, but it is not limited thereto. In other embodiments, the controller 160 is arranged to write the sub-prewrite data sectors into three SLC-spare blocks of the SLC-spare pool SLC_POOL, and writes the sub-prewrite data sectors which is stored in the three SLC-spare blocks into three TLC-data blocks selected from the region R1, the region R2 and the region R3.

It should be noted that the controller 160 is further arranged to define the remaining two regions as the second region and the third region. The controller 160 selects the first TLC-data block according to the TLC-data block assigned to the first logic address, wherein the first TLC-data block is the TLC-data block that is assign to the first logic address. Moreover, when the first TLC-data block belongs to the region R1, the region R1 is the first region, the region R2 is the second region and the region R3 is the third region, that is the addresses of the TLC-data blocks of the first region R1 precede the addresses of the TLC-data blocks of the second region R2 and the third region R3), wherein the address of the first TLC-data block plus N/3 is equal to the address of the second TLC-data block and the address of the first TLC-data block plus (2N)/3 is equal to the address of the third TLC-data block. When the first TLC-data block belongs to the region R2, the region R2 is the first region, the region R3 is the second region, and the region R1 is the third region, that is the addresses of the TLC-data blocks of the first region R2 precede the addresses of the TLC-data blocks of the second region R3 and is the addresses of the TLC-data blocks of the first region R2 are subsequent to the addresses of the TLC-data blocks of the third region R1, wherein the address of the first TLC-data block plus N/3 is equal to the address of the second TLC-data block and the address of the first TLC-data block subtract N/3 is equal to the address of the third TLC-data block. When the first TLC-data block belongs to the region R3, the region R3 is the first region, the region R1 is the second region and the region R2 is the third region, that is the addresses of the TLC-data blocks of the first region R3 are subsequent to the addresses of the TLC-data blocks of the second region R1 and the third region R2, wherein the address of the first TLC-data block subtract (2N)/3 is equal to the address of the second TLC-data block and the address of the first TLC-data block subtract N/3 is equal to the address of the third TLC-data block, and so on. Similarly, when the new first TLC-data block belongs to the region R1, the region R1 is the first region, the region R2 is the second region and the region R3 is the third region, that is the addresses of the TLC-data blocks of the first region R1 precede the addresses of the TLC-data blocks of the second region R2 and the third region R3), wherein the address of the new first TLC-data block plus N/3 is equal to the address of the second TLC-data block and the address of the new first TLC-data block plus (2N)/3 is equal to the address of the third TLC-data block. When the new first TLC-data block belongs to the region R2, the region R2 is the first region, the region R3 is the second region, and the region R1 is the third region, that is the addresses of the TLC-data blocks of the first region R2 precede the addresses of the TLC-data blocks of the second region R3 and is the addresses of the TLC-data blocks of the first region R2 are subsequent to the addresses of the TLC-data blocks of the third region R1, wherein the address of the new first TLC-data block plus N/3 is equal to the address of the second TLC-data block and the address of the new first TLC-data block subtract N/3 is equal to the address of the third TLC-data block. When the new first TLC-data block belongs to the region R3, the region R3 is the first region, the region R1 is the second region and the region R2 is the third region, that is the addresses of the TLC-data blocks of the first region R3 are subsequent to the addresses of the TLC-data blocks of the second region R1 and the third region R2, wherein the address of the new first TLC-data block subtract (2N)/3 is equal to the address of the second TLC-data block and the address of the new first TLC-data block subtract N/3 is equal to the address of the third TLC-data block, and so on.

It should be noted that, in the present invention, the mapping relationship and the assigning relationship of the TLC-data block, the new TLC-data block, and the logic address can be maintained by at least one mapping table. For example, the flash memory 180 has a first mapping table arranged to record the assigning relationships of the TLC-data blocks (the new TLC-data block) and the logic addresses. The flash memory 180 can further include a second mapping table arranged to record the mapping relationships of the TLC-data blocks (the new TLC-data block) which are written by the sub-prewrite data sectors and the logic addresses, wherein the TLC-data blocks (the new TLC-data block) which are written by the sub-prewrite data sectors can be directly mapped to the logic address or the TLC-data blocks (the new TLC-data block) which are written by the sub-prewrite data sectors can be mapped to the TLC-data blocks assigned to the logic addresses, but it is not limited thereto.

For example, the controller 160 writes a plurality of prewrite data sectors into at least one of the logic addresses H_0~H_900 in sequence according to a command, as shown in FIG. 4.

As shown in FIG. 5, when the controller 160 receives a first write command arranged to write a first prewrite data sector into a first logic address H_302 of the logic addresses H_1~H_N, and obtains a first sub-prewrite data sector, a second sub-prewrite data sector and a third sub-prewrite data sector from the first prewrite data sector. The controller 160 locates a first TLC-data block F_302 of the first logic address H_302 according to the first write command arranged to write the first prewrite data sector into the first logic address H_302 of the logic addresses H_1~H_N. Next, the controller 160 determines whether the first TLC-data block F_302 has valid data. Namely, the controller 160 is arranged to determine whether the first TLC-data block F_302 has valid data by determining whether the first TLC-data block F_302 is mapped to any logic address. In this embodiment, the first TLC-data block F_302 does not have valid data, such that the controller 160 selects a second TLC-data block and a third TLC-data block from the region R1 and the region R3, which are regions other than the region R2 containing the first TLC-data block F_302. When the first TLC-data block belongs to the region R2, the region R2 is defined as the first region, and the region R3 is defined as the second region and the region R1 is defined as the third region, that is the addresses of the TLC-data blocks of the first region R2 precede the addresses of the TLC-data blocks of the second region R3, and the addresses of the TLC-data blocks of the first region R2 are subsequent to the addresses of the TLC-data blocks of the third region R1. Therefore, the address of the first TLC-data block plus N/3 is equal to the address of the second TLC-data block, and the address of the first TLC-data block subtracts N/3 is equal to the address of the third TLC-data block. Namely, the controller 160 selects a second TLC-data block F_602 which distances N/3 TLC-data blocks from the first TLC-data block F_302 from the region R3, and selects a third TLC-data block F_2 which distances N/3 TLC-data blocks from the first TLC-data block F_302 from the region R1. Next, the controller 160 writes the first sub-prewrite data sector into the first TLC-data block F_302 by the SLC storage mode, writes the second sub-prewrite data sector into the second TLC-data block F_602 by the SLC storage mode, writes the third sub-prewrite data sector into the third TLC-data block F_2 by the SLC storage mode, and maps the first TLC-data block F_302, the second TLC-data block F_602 and the third TLC-data block F_2 to the first logic address H_302.

Next, the controller 160 receives a second write command arranged to write a second prewrite data sector into a second logic address H_604 of the logic addresses H_1~H_N, and obtains a fourth sub-prewrite data sector, a fifth sub-prewrite data sector and a sixth sub-prewrite data sector from the second prewrite data sector. The controller 160 locates a fourth TLC-data block F_604 which is assigned to the second logic address H_604 according to the second write command arranged to write the second prewrite data sector into the second logic address H_604 of the logic addresses H_1~H_N. Next, the controller 160 determines whether the fourth TLC-data block F_604 has valid data. In this embodiment, the fourth TLC-data block F_604 does not have valid data, such that the controller 160 respectively selects a fifth TLC-data block and a sixth TLC-data block from the region R1 and the region R2 which are regions other than the region R3 having the fourth TLC-data block F_604. When the fourth TLC-data block F_604 belongs to the region R3, the region R3 is defined as first region, the region R1 is defined as the second region and the region R2 is defined as the third region, that is the addresses of the TLC-data blocks of the first region R3 are subsequent to the addresses of the TLC-data blocks of the second region R1 and the third region R2. The address of the fourth TLC-data block F_604 subtracts (2N)/3 is equal to the address of the fifth TLC-data block, and the address of the fourth TLC-data block subtract N/3 is equal to the address of the sixth TLC-data block. Namely, the controller 160 selects the fifth TLC-data block F_4 which distances 2N/3 TLC-data blocks from the fourth TLC-data block F_604 from the region R1, and selects the sixth TLC-data block F_304 which distances N/3 TLC-data blocks from the fourth TLC-data block F_604 from the region R2. Next, the controller 160 writes the fourth sub-prewrite data sector into the fourth TLC-data block F_604 by the SLC storage mode, writes the fifth sub-prewrite data sector into the fifth TLC-data block F_4 by the SLC storage mode, writes the sixth sub-prewrite data sector into the sixth TLC-data block F_304 by the SLC storage mode, and maps the fourth TLC-data block F_604, the fifth TLC-data block F_4 and the sixth TLC-data block F_304 to the second logic address H_604.

Next, the controller 160 receives a third write command arranged to write a third prewrite data sector into a third logic address H_8 of the logic addresses H_1~H_N. the controller 160 locates a seventh TLC-data block F_8 which is assigned to the third logic address H_8 according to the third write command arranged to write the third prewrite data sector into the third logic address H_8 of the logic addresses H_1~H_N, and obtains a seventh sub-prewrite data sector, an eight sub-prewrite data sector and a ninth sub-prewrite data sector. Next, the controller 160 determines whether the seventh TLC-data block F_8 has valid data. In this embodiment, the seventh TLC-data block F_8 does not have valid data, such that the controller 160 locates the region R1 that include the seventh TLC-data block F_8, and selects an eight TLC-data block and a ninth TLC-data block from the region R2 and the region R3 which are regions other than the region R1 having the seventh TLC-data block F_8. When the seventh TLC-data block F_8 belongs to the first region R1, the region R1 is defined as the first region, the region R2 is defined as the second region and the region R3 is defined as the third region, that is the addresses of the TLC-data blocks of the first region R1 precede the addresses of the TLC-data blocks of the second region R2 and the third region R3. The address of the seventh TLC-data block F_8 plus N/3 is equal to the address of the eight TLC-data block, and the address of the seventh TLC-data block F_8 plus (2N)/3 is equal to the address of the ninth TLC-data block. Namely, the controller 160 selects the eight TLC-data block F_8 which distances N/3 TLC-data blocks from the seventh TLC-data block F_8 from the region R2, and selects the ninth TLC-data block F_608 which distances 2N/3 TLC-data blocks from the seventh TLC-data block F_8 from the region R3. Next, the controller 160 writes the seventh sub-prewrite data sector into the seventh TLC-data block F_8 by the SLC storage mode, writes the eight sub-prewrite data sector into the eight TLC-data block F_308 by the SLC storage mode, writes the ninth sub-prewrite data sector into the ninth TLC-data block F_608 by the SLC storage mode, and maps the seventh TLC-data block F_8, the eight TLC-data block F_308 and the ninth TLC-data block F_608 to the third logic address H_8.

Next, the controller 160 receives a fourth write command arranged to write a fourth prewrite data sector to a fourth logic address H_2 of the logic addresses H_1~H_N. The controller 160 locates a tenth TLC-data block F_2 which is assigned to the fourth logic address H_2 according to the fourth write command arranged to write the fourth prewrite data sector to the fourth logic address H_2 of the logic addresses H_1~H_N, and obtains a tenth sub-prewrite data sector, an eleventh sub-prewrite data sector and a twelfth sub-prewrite data sector. Next, the controller 160 determines whether the tenth TLC-data block F_2 has valid data. In this embodiment, the tenth TLC-data block F_2 has valid data (first sub-prewrite data sector) of the first logic address H_302, such that the controller 160 selects another TLC-data block from the TLC-data blocks F_1~F_900 to serve as a new tenth TLC-data block. In this embodiment, the controller 160 selects the TLC-data block F_1, which has the lowest erase count and does not have valid data, from the region R1 including the original tenth TLC-data block F_2 to serve as the new tenth TLC-data block. Next, the controller 160 respectively selects an eleventh TLC-data block and a twelfth TLC-data block from the region R and the region R3 which are regions other than the region R1 having the new tenth TLC-data block F_1. When the new tenth TLC-data block F_1 belongs to the region R1, the region R1 is defined as the first region, the region R2 is defined as the second region, and the region R3 is defined as the third region, that is the addresses of the TLC-data blocks of the first region R1 precede the addresses of the TLC-data blocks of the second region R2 and the third region R3. The address of the new tenth TLC-data block F_1 plus N/3 is equal to the address of the eleventh TLC-data block, and the address of the new tenth TLC-data block F_1 plus (2N)/3 is equal to the address of the twelfth TLC-data block. Namely, the controller 160 selects the eleventh TLC-data block F_301 which distances N/3 TLC-data blocks from the new tenth TLC-data block F_1 from the region R2, and selects the twelfth TLC-data block F_601 which distances 2N/3 TLC-data blocks from the new tenth TLC-data block F_1 from the region R3. Next, the controller 160 is further arranged to write the tenth sub-prewrite data sector into the new tenth TLC-data block F_1 by the SLC storage mode, write the eleventh sub-prewrite data sector into the eleventh TLC-data block F_301 by the SLC storage mode, write the twelfth sub-prewrite data sector into the twelfth TLC-data block F_302 by the SLC storage mode, and maps the new tenth TLC-data block F_1, the eleventh TLC-data block F_301 and the twelfth TLC-data block F_302 to the fourth logic address H_2.

In the second stage, the controller 160 further programs the sub-prewrite data sectors written in the TLC-data blocks into at least one of the TLC-spare blocks TLC_SP_0~TLC_SP_M. For example, the controller 160 selects a first TLC-spare block from the TLC-spare pool TLC_POOL to program the data of the first TLC-data block (or the new first TLC-data block), the second TLC-data block and the third TLC-data block which are mapped to the first logic address into the first TLC-spare block by a TLC storage mode. Next, the controller 160 further maps the programed first TLC-spare block to the first logic address, and releases the first TLC-data block (or the new first TLC-data block), the second TLC-data block and the third TLC-data block, and so on, until all of the sub-prewrite data sectors written in the TLC-data blocks are programed into at least one of the TLC-spare blocks TLC_SP_0~TLC_SP_M.

Figure 6A:
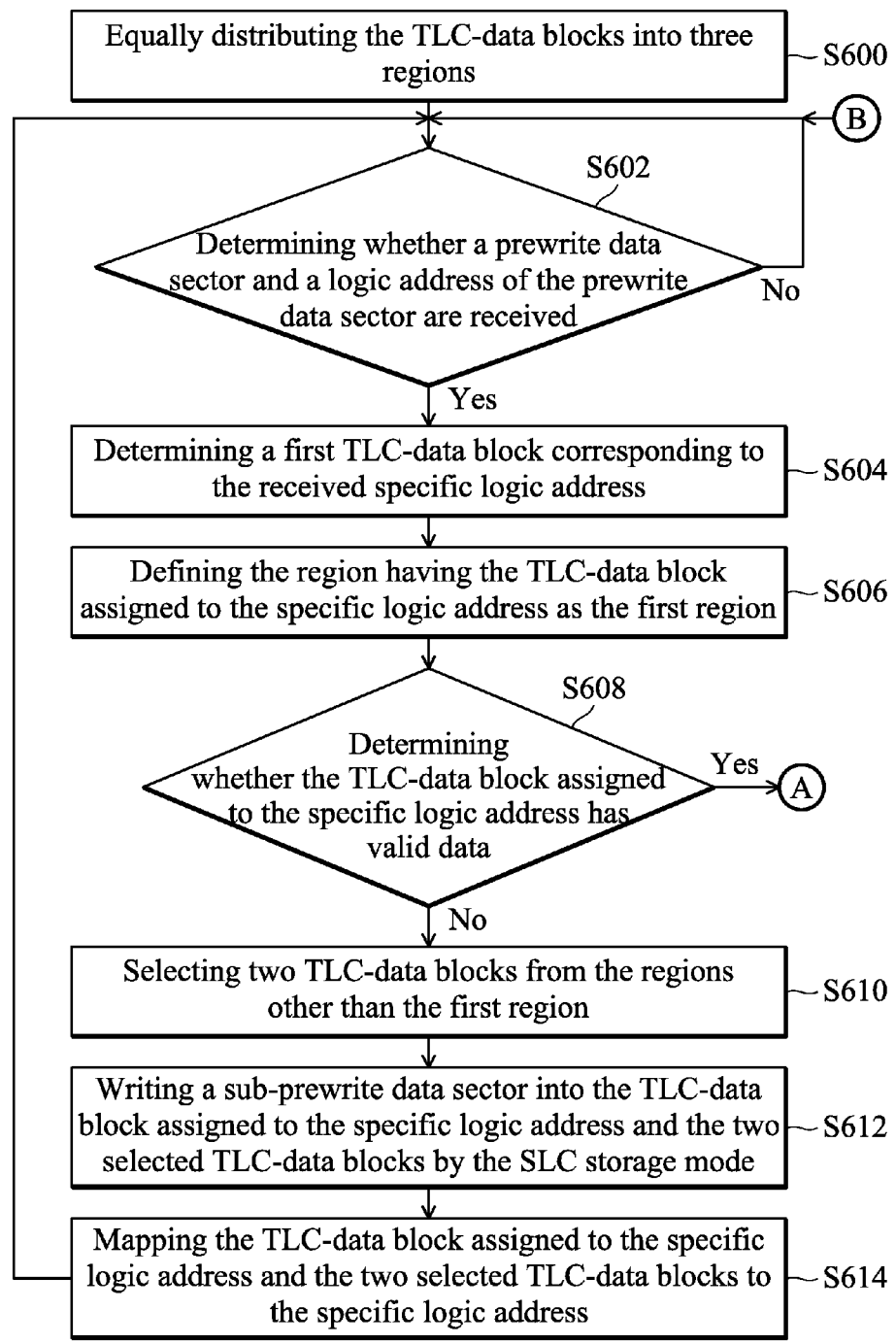
FIG. 6A-6B are a flowchart of a data maintenance method constructed in accordance with an embodiments.
Figure 6B:
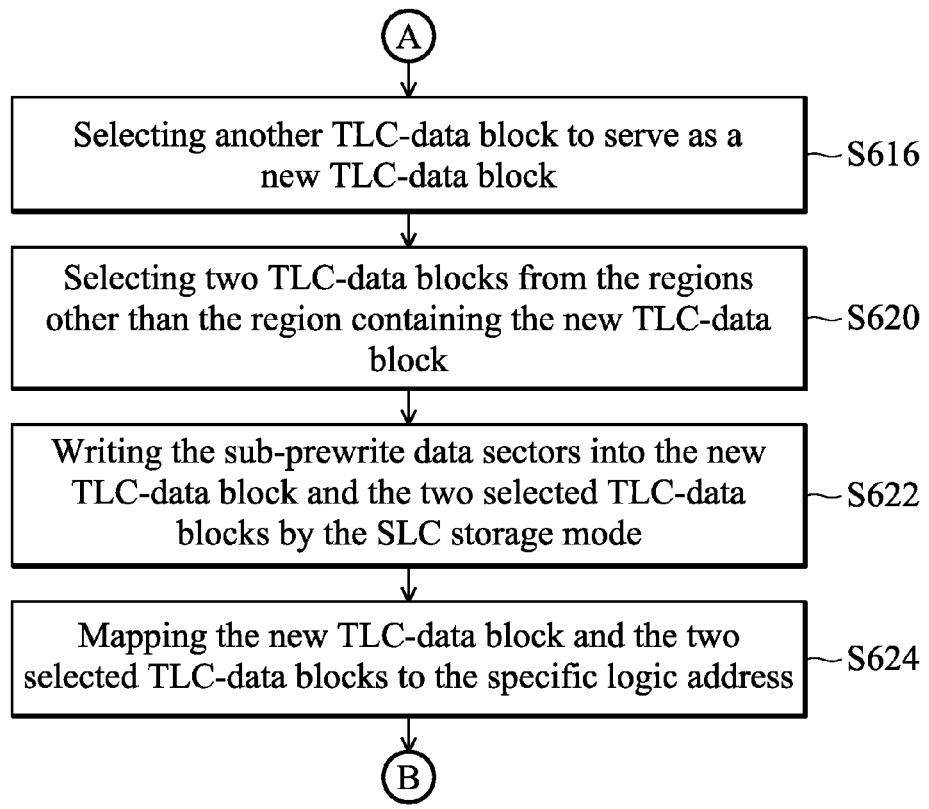

FIG. 6A-6B are a flowchart of a data maintenance method constructed in accordance with an embodiments. The data maintenance method is applied to the data storage device 140 of FIG. 1, wherein the data maintenance method is arranged to write a prewrite data sector into at least one of the logic addresses H_1~H_N in a first stage. The process starts at step S600.

In step S600, the controller 160 equally distributes the TLC-data blocks F_1~F_N into three regions in sequence. In one of the embodiments, the total number of logic addresses is N, the total number of TLC-data blocks is also N, each of the regions R1~R3 has N/3 number of logic addresses and has N/3 number of TLC-data blocks assigned to the N/3 logic addresses, and the logic addresses of the regions R1~R3 are in sequence, as shown in FIG. 3, but it is not limited thereto. Namely, the region R1 includes the logic addresses H_1~H_N/3 having sequential addresses, and includes the TLC-data blocks F_1~F_N/3 having sequential addresses. The region R2 includes the logic addresses H_N/3+1~H_2N/3 having sequential addresses, and includes the TLC-data blocks F_N/3+1~F_2N/3 having sequential addresses. The region R3 includes the logic addresses H_2N/3+1~H_N having sequential addresses, and includes the TLC-data blocks F_2N/3+1~F_N having sequential addresses. For example, when the total number of logic addresses H_0~H_N is 900, the region R1 has the logic addresses H_1~H_300 and the TLC-data blocks F_1~F_300, the region R2 has the logic addresses H_301~H_600 and the TLC-data blocks F_301~F_600, and the region R3 has the logic addresses H_601~H_900 and the TLC-data blocks F_601~F_900, as shown in FIG. 4. In other embodiments, "N" can be other rational numbers, but it is not limited thereto. Moreover, when "N" cannot be divided evenly by 3, the controller 160 can ignore the remaining one or two TLC-data blocks. For example, "N" is 900 when the total number of TLC-data blocks is 901, and "N" is 1200 when the total number of TLC-data blocks is 1202, but it is not limited thereto.

Next, in step S602, the controller 160 determines whether a prewrite data sector and a logic address of the prewrite data sector are received. When the controller 160 receives a prewrite data sector and a logic address, the process goes to step S604, otherwise the controller 160 continues to determine whether a prewrite data sector and a logic address of the prewrite data sector are received. More specifically, the TLC-data blocks F_N are distributed into the regions R1~R3, the controller 160 divides the prewrite-data into a plurality of sub-prewrite data sectors to write the sub-prewrite data sectors into the logic addresses. In one of the embodiments, the controller 160 obtains a first sub-prewrite data sector, a second sub-prewrite data sector, a third sub-prewrite data sector by dividing the prewrite data sector. It should be noted that the controller 160 is arranged to divide the prewrite data sector into the sub-prewrite data sectors according to the size of the triple-level cell. Namely, the data length of each of the sub-prewrite data sectors is equal to the data length of the triple-level cell and is three times the data length of the single-level cell. In other embodiments, the sub-prewrite data sectors can be other data sectors rather than the data sector obtaining by dividing the prewrite data sector.

Next, in step S604, the controller 160 determines a first TLC-data block corresponding to a specific logic address according to the specific logic address which is received in step S602. For example, when the controller 160 receives a write command arranged to write a sub-prewrite data sector into a first logic address H_302 of the logic addresses H_1~H_N in step S602. The controller 160 locates a first TLC-data block F_302 which are assigned to the first logic address H_302 according to the first write command arranged to write the prewrite data sector into the first logic address H_302 of the logic addresses H_1~H_N.

Next, in step S606, the controller 160 defines the region having the TLC-data block assigned to the specific logic address as the first region. In another embodiment, the controller 160 is further arranged to define the remaining two regions as the second region and the third region, respectively.

Next, in step S608, the controller 160 determines whether the TLC-data block assigned to the specific logic address has valid data. When the TLC-data block assigned to the specific logic address does not have valid data, the process goes to step S610. When the TLC-data block assigned to the specific logic address has valid data, the process goes to step S616.

Next, in step S610, the controller 160 selects two TLC-data blocks from the regions other than the first region with the TLC-data block assigned to the specific logic address, respectively. It should be noted that, when the TLC-data block assigned to the specific logic address belongs to the region R1, the region R1 is the first region, the region R2 is the second region and the region R3 is the third region, that is the addresses of the TLC-data blocks of the first region R1 precede the addresses of the TLC-data blocks of the second region R2 and the third region R3. Therefore, the address of the TLC-data block assigned to the specific logic address plus N/3 is equal to the address of the TLC-data block selected from the second region R2, and address of the TLC-data block assigned to the specific logic address plus (2N)/3 is equal to the address of the TLC-data block selected from the third region R3. When the TLC-data block assigned to the specific logic address belongs to region R2, the region R2 is the first region, the region R3 is the second region, and the region R1 is the third region, that is the addresses of the TLC-data blocks of the first region R2 precede the addresses of the TLC-data blocks of the second region R3 and is the addresses of the TLC-data blocks of the first region R2 are subsequent to the addresses of the TLC-data blocks of the third region R1, wherein the address of the TLC-data block assigned to the specific logic address plus N/3 is equal to the address of the TLC-data block selected from the second region R3 and the address of the TLC-data block assigned to the specific logic address subtracts N/3 is equal to the address of the TLC-data block selected from the third region R1. When the TLC-data block assigned to the specific logic address belongs to the region R3, the region R3 is the first region, the region R1 is the second region and the region R2 is the third region, that is the addresses of the TLC-data blocks of the first region R3 are subsequent to the addresses of the TLC-data blocks of the second region R1 and the third region R2, wherein the address of the TLC-data block assigned to the specific logic address subtracts (2N)/3 is equal to the address of the TLC-data block selected from the second region R1 and the address of the TLC-data block assigned to the specific logic address subtracts N/3 is equal to the address of the TLC-data block selected from the third region R2, and so on.

For example, when the controller 160 receives a first write command arranged to write a first prewrite data sector into a first logic address H_302 of the logic addresses H_1~H_N in the step S602, and the controller 160 defines the region R2 containing the first TLC-data block F_302 as the first region in the step S606 when the first TLC-data block F_302 which is assigned to the first logic address H_302 and does not have valid data is located in the step S604. Next, the controller 160 selects a second TLC-data block and a third TLC-data block from the region R1 and the region R3 which are the regions other than the region R2 including the first TLC-data block F_302. When the first TLC-data block belongs to the region R2, the address of the first TLC-data block plus N/3 is equal to the address of the second TLC-data block, and the address of the first TLC-data block subtracts N/3 is equal to the address of the third TLC-data block. Namely, the controller 160 selects a second TLC-data block F_602 which distances N/3 TLC-data blocks from the first TLC-data block F_302 from the region R3, and selects a third TLC-data block F_2 which distances N/3 TLC-data blocks from the first TLC-data block F_302 from the region R1. In other embodiments, when the first TLC-data block is the TLC-data block F_604 of the region R3, the address of the fourth TLC-data block F_604 subtracts (2N)/3 is equal to the address of the fifth TLC-data block, and the address of the fourth TLC-data block subtract N/3 is equal to the address of the sixth TLC-data block. Namely, the controller 160 selects the fifth TLC-data block F_4 which distances 2N/3 TLC-data blocks from the fourth TLC-data block F_604 from the region R1, and selects the sixth TLC-data block F_304 which distances N/3 TLC-data blocks from the fourth TLC-data block F_604 from the region R2. When the first TLC-data block is the TLC-data block F_8 of the region R1, the address of the seventh TLC-data block F_8 plus N/3 is equal to the address of the eight TLC-data block, and the address of the seventh TLC-data block F_8 plus (2N)/3 is equal to the address of the ninth TLC-data block. Namely, the controller 160 selects the eight TLC-data block F_8 which distances N/3 TLC-data blocks from the seventh TLC-data block F_8 from the region R2, and selects the ninth TLC-data block F_608 which distances 2N/3 TLC-data blocks from the seventh TLC-data block F_8 from the region R3.

Next, in step S612, the controller 160 writes a sub-prewrite data sector into the TLC-data block assigned to the specific logic address and the two TLC-data blocks selected in the step S610 by the SLC storage mode.

Next, in step S614, the controller 160 maps the TLC-data block assigned to the specific logic address and the two TLC-data blocks selected in the step S610 to the specific logic address. Namely, the controller 160 maps the three TLC-data blocks written by the sub-prewrite data sectors in the step S612 to the specific logic address. Next, the process returns to step S602. The controller 160 continues to write the sub-prewrite data sectors to the indicated logic addresses in response to the received write commands.

In step S616, the controller 160 selects another TLC-data block to serve as the new TLC-data block. Namely, the new TLC-data block is arranged to replace the TLC-data block assigned to the specific logic address. In one of the embodiments, each of the TLC-data blocks has an erase count, and the controller 160 selects the TLC-data block that has the lowest erase count and does not have valid data from the first region to serve it as the new TLC-data block, but it is not limited thereto. Namely, the controller 160 is arranged to select the TLC-data block with the least number of times of being erased and without valid data to be the new TLC-data block. In other embodiments, the controller 160 can also select the TLC-data block that has no valid data and is the closest one to the TLC-data block which is assigned to the specific logical address from the first region to serve as the new TLC-data block.

Next, in step S620, the controller 160 respectively selects two TLC-data blocks from the regions other than the region containing the new TLC-data block. It should be noted that when the new TLC-data block belongs to the region R1, the address of the new TLC-data block plus N/3 is equal to the address of one of the selected TLC-data block, and the address of the new TLC-data block plus (2N)/3 is equal to the address of the another selected TLC-data block. When the new TLC-data block belongs to the region R2, the address of the new TLC-data block plus N/3 is equal to the address of one of the selected TLC-data block, and the address of the new TLC-data block subtracts N/3 is equal to the address of another selected TLC-data block. When the new TLC-data block belongs to the region R3, the address of the new TLC-data block subtracts (2N)/3 is equal to the one of the selected TLC-data block and the address of the new TLC-data block subtracts N/3 is equal to the address of the another selected TLC-data block, and so on.

Take FIG. 5 as an example, when the controller 160 receives a fourth write command arranged to write a fourth prewrite data sector to a fourth logic address H_2 of the logic addresses H_1~H_N in the step S602, the controller 160 locates a tenth TLC-data block F_2 which is assigned to the fourth logic address H_2 according to the fourth write command in step S604. Next, the controller 160 determines whether the tenth TLC-data block F_2 has valid data in step S608. In this embodiment, the tenth TLC-data block F_2 has valid data (first prewrite data sector) corresponding to the first logic address H_302, such that the controller 160 is arranged to select another TLC-data block from the TLC-data blocks F1~F_900 to serve as the new TLC-data block. In this embodiment, the controller 160 selects the TLC-data block F_1 which has the lowest erase count and does not have valid data to be the new TLC-data block. Next, the controller 160 selects an eleventh TLC-data block and a twelfth TLC-data block from the region R2 and the region R3 other than the region R1 having the new TLC-data block F_1 (step S620). When the new TLC-data block F_1 belongs to the region R1, the address of the new TLC-data block F_1 plus N/3 is equal to the address of the eleventh TLC-data block, and the address of the new TLC-data block F_1 plus (2N)/3 is equal to the address of the twelfth TLC-data block. Namely, the controller 160 selects the eleventh TLC-data block F_301 which distances N/3 TLC-data blocks from the new tenth TLC-data block F_1 from the region R2, and selects the twelfth TLC-data block F_601 which distances 2N/3 TLC-data blocks from the new tenth TLC-data block F_1 from the region R3. In other embodiments, when the new TLC-data block is the TLC-data block F_604 which belongs to the region R3, the address of the new TLC-data block F_604 subtracts (2N)/3 is equal to the address of the second TLC-data block, and the address of the first TLC-data block subtracts (N)/3 is equal to the address of the third TLC-data block. Namely, the controller 160 selects the fifth TLC-data block F_4 which distances 2N/3 TLC-data blocks from the fourth TLC-data block F_604 from the region R1, and selects the sixth TLC-data block F_304 which distances N/3 TLC-data blocks from the fourth TLC-data block F_604 from the region R2. When the new TLC-data block is the TLC-data block F_8 belongs to the region R1, the address of the new TLC-data block F8 plus N/3 is equal to the address of the second TLC-data block, and the address of the new TLC-data block F_8 plus (2N)/3 is equal to the address of the third TLC-data block. Namely, the controller 160 selects a second TLC-data block F_8 which distances N/3 TLC-data blocks from the new TLC-data block F_8 from the region R2, and selects a third TLC-data block F_608 which distances 2N/3 TLC-data blocks from the new TLC-data block F_8 from the region R3.

Next, in step S622, the controller 160 writes the sub-prewrite data sectors into the new TLC-data block and the two TLC-data blocks selected in the step S620 by the SLC storage mode.

Next, in step S624, the controller 160 maps the new TLC-data block and the two TLC-data blocks selected in the step S620 to the specific logic address. Namely, the controller 160 maps the three TLC-data blocks which are written by the prewrite data sector in the step S622 to the specific logic address. Next, the process returns to step S602. The controller 160 continues to write the prewrite data sector to the indicated logic address in response to the received write command.

Figure 7:
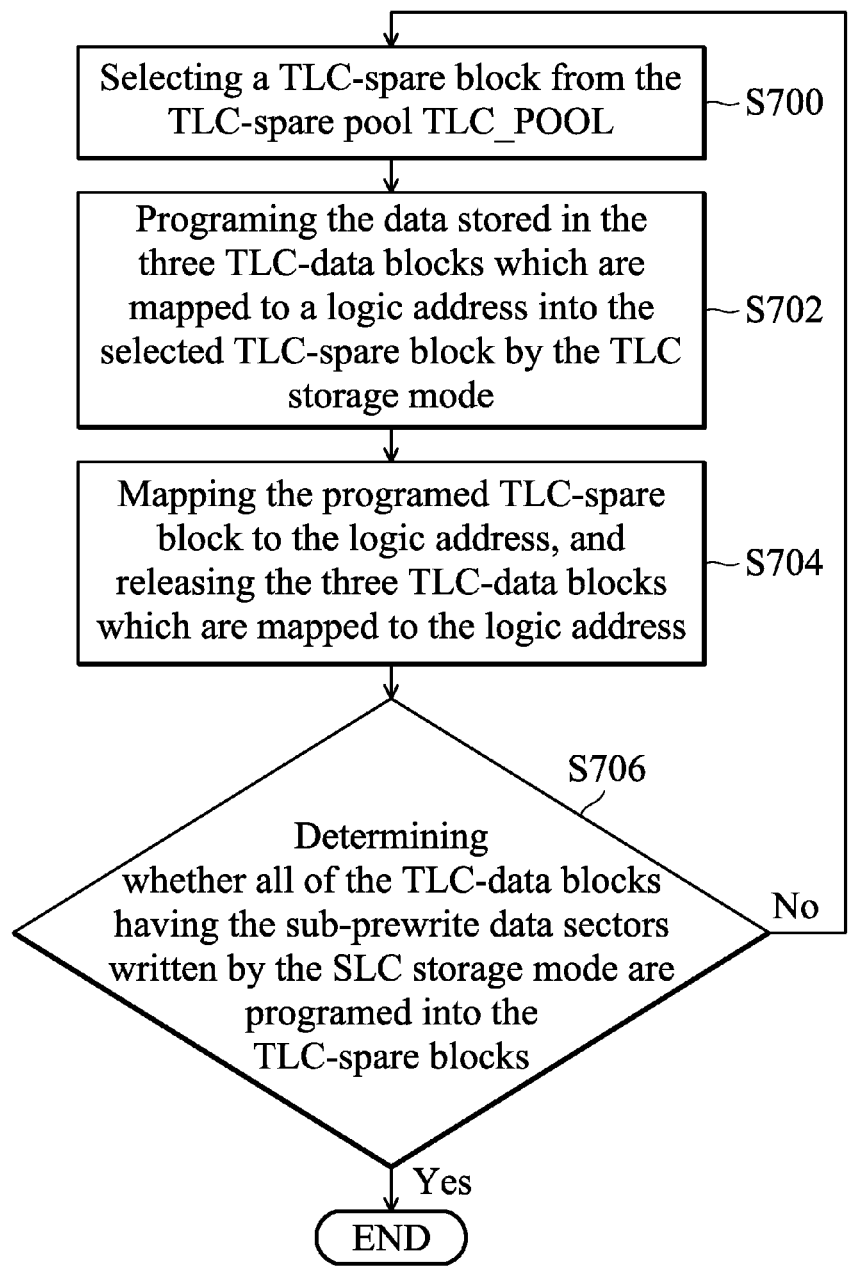
FIG. 7 is a flowchart of a data maintenance method constructed in accordance with another embodiment.

FIG. 7 is a flowchart of a data maintenance method constructed in accordance with another embodiment. The data maintenance method is applied to the data storage device 140 of FIG. 1, wherein the data maintenance method is arranged to program the data in the TLC-data blocks written by the sub-prewrite data sectors into at least one of the TLC-spare blocks TLC_SP_0~TLC_SP_M in the second stage. The process starts at step S700.

In step S700, the controller 160 selects a TLC-spare block from the TLC-spare pool TLC_POOL.

Next, in step S702, the controller 160 programs the data stored in the three TLC-data blocks which are mapped to a logic address into the TLC-spare block selected in the step S700 by the TLC storage mode.

Next, in step S704, the controller 160 is arranged to map the programed TLC-spare block to the logic address, and release the three TLC-data blocks which are mapped to the logic address.

Next, in step S706, the controller 160 determines whether all of the TLC-data blocks having the sub-prewrite data sectors written by the SLC storage mode are programed into the TLC-spare blocks. When all of the TLC-data blocks having the sub-prewrite data sectors written by the SLC storage mode are programed into the TLC-spare blocks, the process ends at step S706, otherwise, the returns to the step S700, the controller 160 continues to process the un-programed TLC-data blocks in accordance to the order of the logic addresses. For example, the controller 160 selects a first TLC-spare block from the TLC-spare pool TLC_POOL to program the data stored in the first TLC-data block (or the new TLC-data block), the second TLC-data block and the third TLC-data block which are mapped to the first logic address into the first TLC-spare block by the TLC storage mode. Next, the controller 160 is further arranged to map the programed first TLC-spare block to the first logic address, and release the first TLC-data block (or the new TLC-data block), the second TLC-data block and third TLC-data block.

As described above, the data storage device and the data maintenance method of the present invention can select the blocks in a predetermined order for temporarily storing the data by SLC mode for the TLC blocks.

Data transmission methods, or certain aspects or portions thereof, may take the form of a program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the methods. The methods may also be embodied in the form of a program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application-specific logic circuits.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
    a flash memory, having a plurality of single-level cell (SLC)-spare blocks, a plurality of triple-level cell (TLC)-data blocks, and a plurality of TLC-spare blocks; and
    a controller, equally distributing the TLC-data blocks into three regions having the same number of TLC-data blocks, and receiving a prewrite data sector and a logic address of the prewrite data sector, and obtaining a first sub-prewrite data sector, a second sub-prewrite data sector and a third sub-prewrite data sector according to the prewrite data sector and the logic address, wherein in a first stage, the controller further;
        determining a first TLC-data block corresponding to the logic address of the prewrite data sector according to the logic address, defining the region that contains the first TLC-data block as a first region;
        determining whether the first TLC-data block has valid data, selecting a TLC-data block with the lowest erase count from the first region to serve as a new first TLC-data block when the first TLC-data block has valid data;
        selecting a second TLC-data block and a third TLC-data block from the regions other than the first region according to the new first TLC-data block;
        respectively writing the first sub-prewrite data sector, the second sub-prewrite data sector and the third sub-prewrite data sector into the new first TLC-data block, the second TLC-data block and the third TLC-data block by a SLC storage mode; and
        mapping the first new TLC-data block, the second TLC-data block, the third TLC-data block to the logic address.

2. The data storage device as claimed in claim 1, wherein total number of the TLC-data blocks is N, each of the TLC-data blocks has an address, and the addresses of the TLC-data blocks are in sequence.

3. The data storage device as claimed in claim 2, wherein the controller further respectively defines the regions other than the first region as a second region and a third region, wherein the address of the new first TLC-data block plus N/3 is equal to the address of the second TLC-data block and the address of the new first TLC-data block plus (2N)/3 is equal to the address of the third TLC-data block when the addresses of the TLC-data blocks of the first region precede the addresses of the TLC-data blocks of the second region and the third region, the address of the new first TLC-data block plus N/3 is equal to the address of the second TLC-data block and the address of the new first TLC-data block subtract N/3 is equal to the address of the third TLC-data block when the addresses of the TLC-data blocks of the first region precede the addresses of the TLC-data blocks of the second region and are subsequent to the addresses of the TLC-data blocks of the third region, and the address of the new first TLC-data block subtract (2N)/3 is equal to the address of the second TLC-data block and the address of the new first TLC-data block subtract N/3 is equal to the address of the third TLC-data block when the addresses of the TLC-data blocks of the first region are subsequent to the addresses of the TLC-data blocks of the second region and the third region.

4. The data storage device as claimed in claim 1, wherein in a second stage, the controller further programs data in the new first TLC-data block, the second TLC-data block and the third TLC-data block into one of the TLC-spare blocks, wherein the controller further selects a first TLC-spare block from the TLC-spare blocks to program the data in the new first TLC-data block, the second TLC-data block and the third TLC-data block, which are mapped to the logic address, into the first TLC-spare block by a TLC storage mode, maps the programmed first TLC-spare block to the logic address, and releases the new first TLC-data block, the second TLC-data block and the third TLC-data block.

5. The data storage device as claimed in claim 4, wherein the first stage is Production Phase, the second stage, which is after the first stage, is Integration Phase, and the data storage device goes through a high-temperature soldering between the first stage and the second stage.

6. A data maintenance method, applied to a data storage device having a plurality of single-level cell (SLC)-spare block, a plurality of triple-level cell (TLC)-data blocks and a plurality of TLC-spare blocks, the data maintenance method comprising:
receiving a prewrite data sector and a logic address of the prewrite data sector, and obtaining a first sub-prewrite data sector, a second sub-prewrite data sector and a third sub-prewrite data sector according to the prewrite data sector and the logic address; and
writing the prewrite data sector into the data storage device according to the prewrite data sector and the logic address in a first stage, wherein the step of writing the prewrite data sector into the data storage device in the first stage further comprises:
equally distributing the TLC-data blocks into three regions, wherein the regions have the same number of TLC-data blocks;
determining a first TLC-data block corresponding to the logic address of the prewrite data sector according to the logic address, defining the region that contains the first TLC-data block as a first region;
determining whether the first TLC-data block has valid data;
selecting a TLC-data block with the lowest erase count from the first region to serve as a new first TLC-data block and selecting a second TLC-data block and a third TLC-data block from the regions other than the first region according to the new first TLC-data block when the first TLC-data block has valid data;
respectively writing the first sub-prewrite data sector, the second sub-prewrite data sector and the third sub-prewrite data sector into the new first TLC-data block, the second TLC-data block and the third TLC-data block by a SLC storage mode; and
mapping the first new TLC-data block, the second TLC-data block, the third TLC-data block to the logic address.

7. The data maintenance method as claimed in claim 6, wherein total number of TLC-data blocks is N, each of the TLC-data blocks has an address, and the addresses of the TLC-data blocks are in sequence.

8. The data maintenance method as claimed in claim 7, wherein the regions other than the first region are respectively defined as a second region and a third region, wherein the address of the new first TLC-data block plus N/3 is equal to the address of the second TLC-data block and the address of the new first TLC-data block plus (2N)/3 is equal to the address of the third TLC-data block when the addresses of the TLC-data blocks of the first region precede the addresses of the TLC-data blocks of the second region and the third region, the address of the new first TLC-data block plus N/3 is equal to the address of the second TLC-data block and the address of the new first TLC-data block subtract N/3 is equal to the address of the third TLC-data block when the addresses of the TLC-data blocks of the first region precede the addresses of the TLC-data blocks of the second region and are subsequent to the addresses of the TLC-data blocks of the third region, and the address of the new first TLC-data block subtract (2N)/3 is equal to the address of the second TLC-data block and the address of the new first TLC-data block subtract N/3 is equal to the address of the third TLC-data block when the addresses of the TLC-data blocks of the first region are subsequent to the addresses of the TLC-data blocks of the second region and the third region.

9. The data maintenance method as claimed in claim 6, wherein in a second stage the data maintenance method further comprises:
programming data in the new first TLC-data block, the second TLC-data block and the third TLC-data block into one of the TLC-spare blocks, wherein the step of programming data in the new first TLC-data block, the second TLC-data block and the third TLC-data block into one of the TLC-spare blocks further comprises:
selecting a first TLC-spare block from the TLC-spare blocks;
programming the data in the new first TLC-data block, the second TLC-data block and the third TLC-data block, which are mapped to the logic address, into the first TLC-spare block by a TLC storage mode;
mapping the programmed first TLC-spare block to the logic address; and
releasing the new first TLC-data block, the second TLC-data block and the third TLC-data block.

10. The data maintenance method as claimed in claim 9, wherein the first stage is Production Phase, the second stage, which is after the first stage, is Integration Phase, and the data storage device goes through a high-temperature soldering event between the first stage and the second stage.

* * * * *